United States Patent [19]

Young

[11] Patent Number: 4,458,203

[45] Date of Patent: Jul. 3, 1984

[54] NUCLEAR MAGNETIC RESONANCE IMAGING

[75] Inventor: Ian R. Young, Middlesex, England

[73] Assignee: Picker International Limited, Middlesex, England

[21] Appl. No.: 326,361

[22] Filed: Dec. 1, 1981

[30] Foreign Application Priority Data

Dec. 11, 1980 [GB] United Kingdom ............... 8039702

[51] Int. Cl.³ ............................................. G01R 33/08
[52] U.S. Cl. ..................................... 324/309; 324/307
[58] Field of Search ........................ 324/300, 307, 309

[56] References Cited

U.S. PATENT DOCUMENTS 4,284,948 8/1981 Young ................................. 324/309
4,318,043 3/1982 Crooks ............................... 324/309

FOREIGN PATENT DOCUMENTS 1525564 9/1978 United Kingdom .
2037996 7/1980 United Kingdom .

Primary Examiner—Michael J. Tokar
Attorney, Agent, or Firm—Watts, Hoffmann, Fisher & Heinke Co.

[57] ABSTRACT

A method of imaging a body by nuclear magnetic resonance wherein volume scanning of a region of the body is achieved by scanning a first planar slice of the region and at least one further slice of the region in the relaxation time for the scan of the first slice.

5 Claims, 5 Drawing Figures

NUCLEAR MAGNETIC RESONANCE IMAGING

This invention relates to imaging a body by nuclear magnetic resonance (NMR) and is particularly related to imaging a volume of a body rather than a substantially planar slice. NMR imaging is especially suitable for examination of the body of a patient for medical purposes.

Proposals have been made for scanning volumes of bodies by NMR using various specialised procedures. These are lengthy procedures because, inter alia, on the assumption of three dimensional scanning, $n^2$ experiments are needed, with n lines from each experiment, for an $n^3$ volume. Thus, if the time needed for relaxation, in each experiment is $T_R$, the minimum scanning time is $n^2 T_R$. It is an object of this invention to provide a more rapid volume scanning procedure.

According to the invention in a method of imaging a body by nuclear magnetic resonance volume scanning of a region of the body is achieved by scanning in a first planar slice of the region and scanning in at least one further planar slice of the region in the relaxation time for the scan of the first slice.

In order that the invention may be clearly understood and readily carried into effect an example thereof will now be described with reference to the accompanying drawings in which.

The basic principles of NMR imaging are now well documented, for example, in U.S. Pat. No. 4,284,948 which is hereby incorporated in the present specification by reference, and will not therefore be described here.

The method to be described by way of example relates to imaging of a body using so-called $T_1$ experiments yielding data relating to the spin-lattice relaxation time $(T_1)$ of protons in the body under examination.

Figure 1:
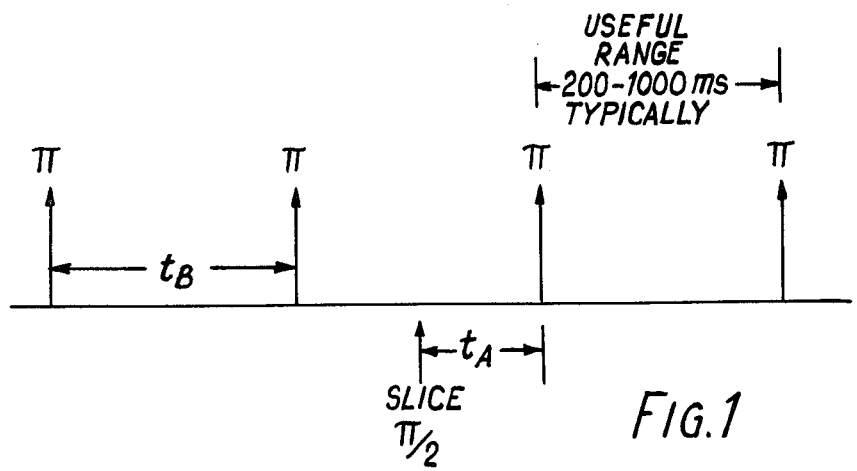
FIG. 1 shows a pulse sequence of a conventional NMR imaging method.

Referring to FIG. 1, in a normal $T_1$ experiment a $\pi$ radio frequency (RF) pulse is applied without magnetic field gradients for slice selection, followed by a $\pi/2$ RF pulse, with field gradients for slice selection after a relaxation period $\tau$, immediately following which the free induction decay (FID) is measured. Thus the sequence used is, $\pi$ (unselected), $\tau$, $\pi/2$ (selected), FID measured.

The signal is then of the form $M(1-2T\tau)$ when M is the number of available protons and $T\tau = e\ (-\tau/T_1)$ $(\tau \neq 0.69\ T_1)$.

For volume scanning there is established a regular sequence of $\pi$ pulses as shown in FIG. 1, at intervals of time $t_B$. At some time after one of these a slice is selected and imaged. If this is at a time $t_A$ before the following pulse, and the experiment is repeated with one slice selection for each pair of $\pi$ pulses, then the signal is of the form $M(1-T_B)(1-2T_C)$, where $$T_B = e^{-\frac{t_B}{T_1}} \text{ and } T_C = e^{-\frac{t_B - t_A}{T_1}}$$

Now $t_B - t_A$ for any slice is known, and can be written $kt_B$ so the signal is of the form $M(1-T_B)(1-yT_B)$, that is of the form $$M(1-(1+y)T_B + yT_B^2) = M(1 + zT_B + yT_B^2)$$

where z and y are constants for a particular slice.

Similar relations exist for systems with more $\pi$ flips between slice selections.

This indicates that most of each interval between $\pi$ pulses can be used for scanning slices, as long as the slices scanned between successive $\pi$ pulses are all different.

Figure 2:
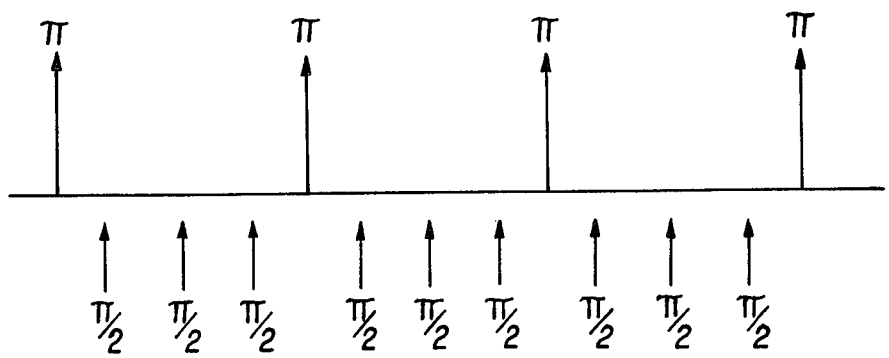
FIG. 2 illustrates a pulse sequence of a method according to the present invention.

Thus, in accordance with the invention a series of $\pi/2$ RF pulses each with field gradients for selecting a different slice are applied in turn between successive $\pi$ pulses, as illustrated in FIG. 2. If x is the number of slices scanned between successive $\pi$ pulses then the minimum scanning time for an $n^3$ volume is reduced from the value of $n^2 T_R$ stated above to $$\frac{n^2 T_R}{x}.$$

As well as scanning different slices, the same slice may be scanned for different relaxation times $t_B - t_A$.

The time taken to scan a single slice is typically about 50 milliseconds. Hence, with a typical value for $t_B$ of between 200 and 1,000 milliseconds, four to twenty different slices may be scanned between successive $\pi$ pulses. Due to slice edge effects contiguous slices cannot be scanned between successive $\pi$ pulses so that even if it were possible to scan enough slices between successive $\pi$ pulses to achieve adequate resolution through a volume being examined, it would not be practical to do so. A minimum scan time is thus obtained when $x = 0.5\ n$.

In practice it is easier using conventional apparatus to scan fewer slices, and to achieve adequate resolution by varying the size of the usual phase correction magnetic field gradient pulse applied following the slice selection field gradient pulse. Thus, if the correct phase correction gradient pulse is a fraction k of the slice selection one, fractions $(k-\delta)$ and $(k+\delta)$ result in gradients across the slice, and are analoguous to the gradient steps in the modified echo planar imaging system (see United Kingdom Patent Specification No. 2056078A). A slice can thus be resolved into three subslices. Such a configuration can be used to produce a volume scan in six times the time for a single slice, with acceptable duty cycle for the slice selection system.

As an alternative it is possible to rephase z inexactly to give small z resolution for up to eight slices.

The easiest way of effecting slice selection is to use a pulse of frequency $(f + \delta f)$ for the $\pi/2$ RF pulses where $\delta f$ ranges over a set of increments $\pm m\delta f_o$ (including $m_o = 0$), and then demodulate with f (or f + offset). This requires the RF coil system to be of relatively wide bandwidth, but the receiver maintains a normal passband.

This invention may be implemented on a suitable NMR examining apparatus such as that disclosed in U.S. Pat. No. 4,284,948 which is shown in simplified form in FIG. 3. Illustrated schematically only are: coils 6, which provide a steady $B_o$ field; 7, which provide a $G_x$ field gradient and 8 which provide a $G_y$ field gradient together forming a field in the z direction with a gradient in a variable direction R orthogonal to the z direction; 9, which provide the RF fields; and 10, which provide a $G_z$ field gradient. The coils are driven by $B_o$, $G_x$, $G_y$, RF and $G_z$ drive amplifiers 11, 12, 13, 14, and 15 respectively, controlled by $B_o$, $G_{xy}$, RF and $G_z$ control circuits 16, 17, 18 and 19 respectively. These circuits can take suitable forms which will be well known to those with experience of NMR equipment and other apparatus using coil induced magnetic fields. The circuits are controlled by a central processing and control unit 20 to achieve a desired pulse sequence such as that of this invention.

The NMR signals subsequently sensed are received in this example by the RF coils 9 and are amplified by an RF amplifier 21 before being applied to signal handling circuits 22. In certain circumstances it may be preferable to provide separate coils specifically designed for the purpose, to sense the signal. The circuits 22 are arranged to make any appropriate calibrations and corrections but essentially transmit the signals to the processing circuits to provide the required representation of the examined slice. These circuits can conveniently be combined with the circuits which control the pulse sequence and thus are included in the circuits indicated at 20. The information thus obtained can be displayed on a display 23, such as a television monitor, and this may include inputs and other peripherals 24 for the provision of commands and instructions to the machine, or other forms of output.

Figure 4:
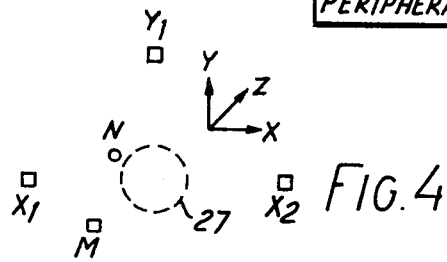
FIG. 4 shows a distribution of field sensing probes used in the apparatus of FIG. 3.

The apparatus also includes field measurements and error signal circuits 25 which receive signals via amplifiers 26 from field probes $X_1$, $X_2$, $Y_1$, and $Y_2$, shown. The positions of the probes, in relation to the examined slice of the body 27 of the patient, are further shown in FIG. 4. $X_1$, $X_2$, $Y_1$ and $Y_2$ are in this example simply miniature cells of pure, or slightly doped water (such as a closed test tube) surrounded by a small coil. Preferably the water is doped to have a suitable value of $T_1$, relaxation time-constant. The probes give a reliable resonance of 4.26 $kH_z$/Oe. Other types of probe may be used as desired.

Figure 3:
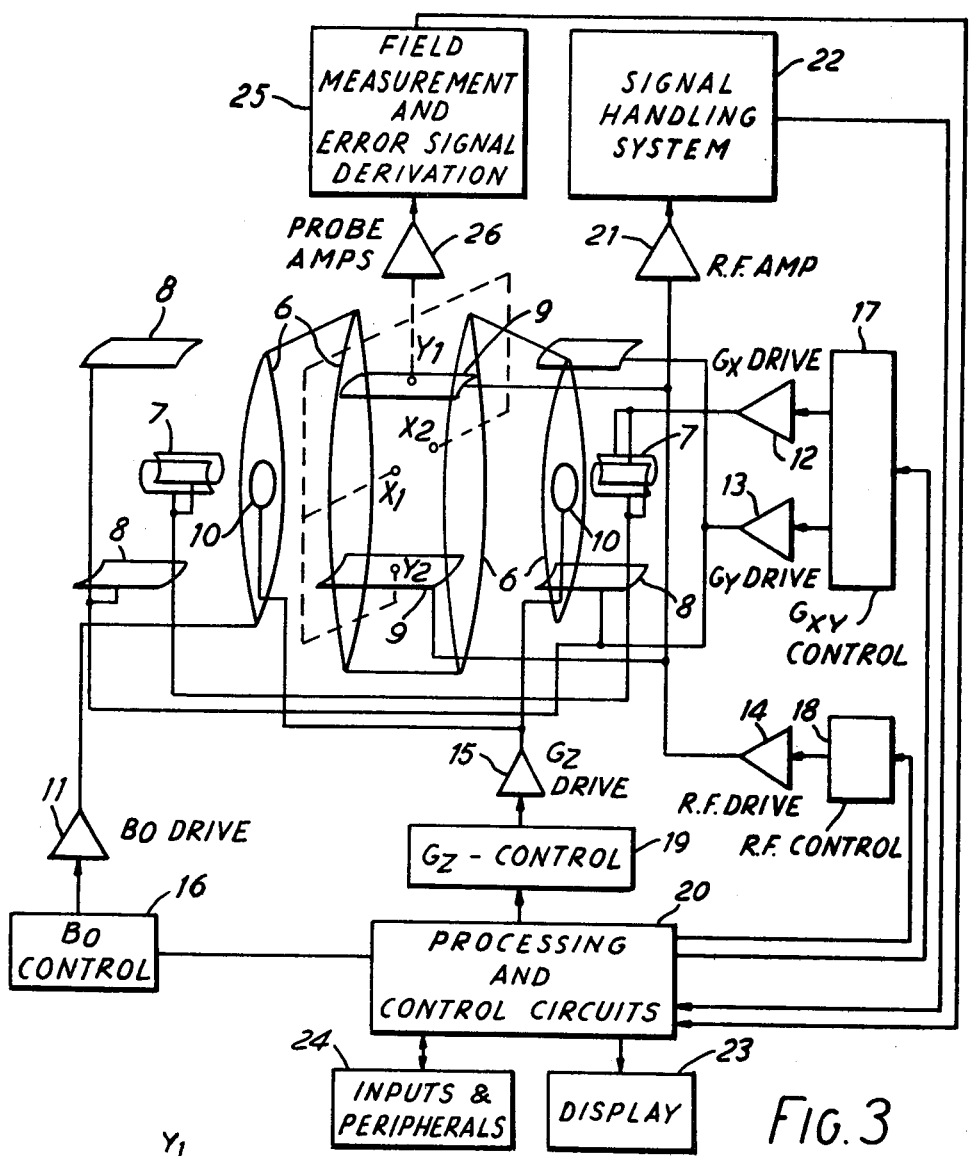
FIG. 3 is a diagram of an NMR apparatus suitable for carrying out the method according to the invention.
Figure 5:
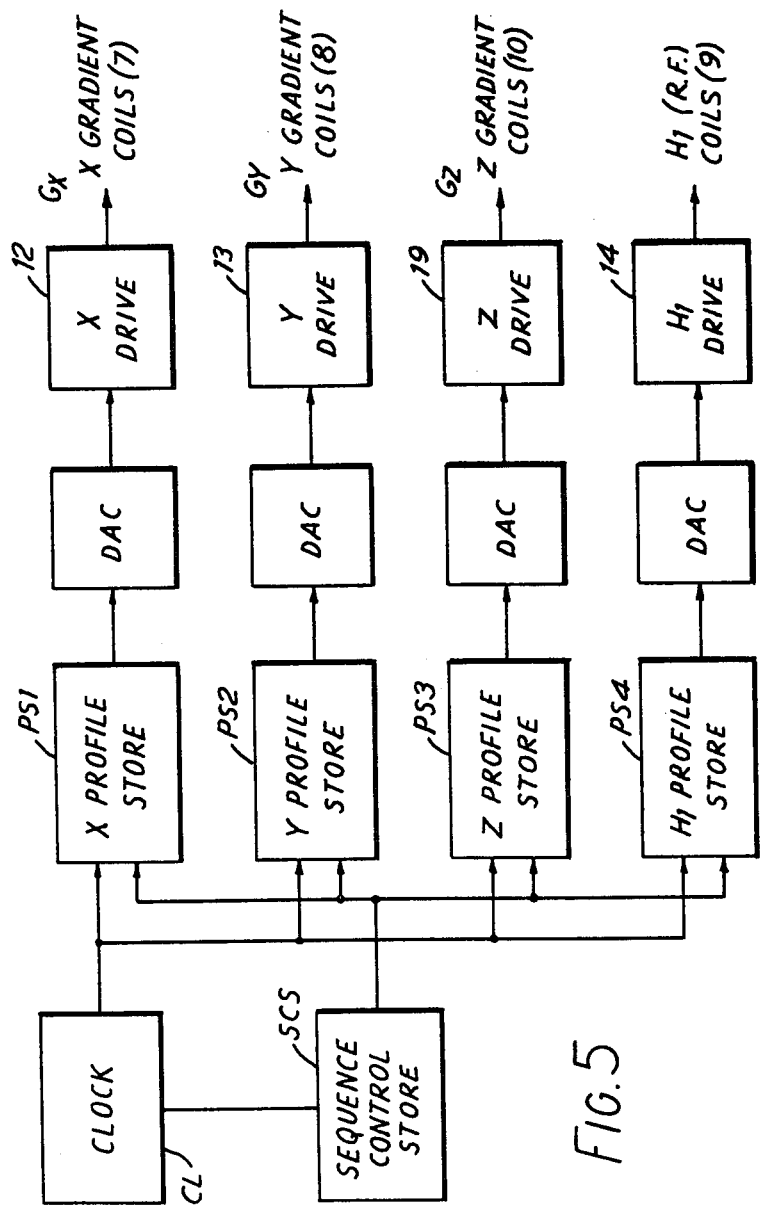
FIG. 5 illustrates the circuits used to control the application of pulses to the field coils of the apparatus of FIG. 2.

FIG. 5 shows, in schematic view, components which may typically form part of the processing and control circuits 20 of FIG. 3. Four profile stores PS1-4 store the required pulse shapes in terms of a sequence of current amplitudes and the required duration (number of clock pulses) at each amplitude. The specified current at any instant is then supplied by the corresponding drive circuit (12, 13, 19 or 14) to the corresponding coil (7, 8, 10 or 9). The operation of the four profile stores is controlled by a sequence control store SCS which stores the sequence of activation of the profile stores and the duration (number of clock pulses) of operation of each stage of the sequence (including gaps in the pulse sequence). A clock CL controls the overall timing operation of the circuits.

Clearly this invention may be implemented by appropriately storing in the profile and sequence control stores information about the various field pulses required to be applied. Other implementations are, of course, possible within the scope of the invention.

I claim:

1. A method of imaging a body by nuclear magnetic resonance using data obtained by $T_1$ experiments wherein volume scanning of a region of the body is achieved by scanning for $T_1$ data in each of a plurality of planar parallel slices of said region by applying in turn a series of $\pi/2$ radio frequency pulses, each with magnetic field gradients for selecting a different one of said slices, between successive ones of a sequence of $\pi$ radio frequency pulses, the scan of at least one slice occurring in the relaxation time for the scan of at least one other slice.

2. A method according to claim 1 wherein slice selection is effected by controlling the frequency of the ($\pi/2$) pulses.

3. A method according to claim 1 wherein the slice selection field gradients include a phase correction magnetic field gradient pulse whose size is varied so as to resolve a scanned slice into a plurality of subslices.

4. A method of imaging a body by nuclear magnetic resonance using data obtained by $T_1$ experiments, said method comprising the steps of:
    (a) producing a sequence of $\pi$ radio frequency pulses;
    (b) applying in turn a series of 90/2 radio frequency pulses, each with a magnetic field gradient for selecting a different slice of the body;
    (c) scanning for $T_1$ data in each of a plurality of planar parallel slices of said region to achieve volume scanning of a region, said $\pi/2$ frequency pulses taking place between successive ones of said sequence of radio frequency pulses, and
    (d) wherein said scanning of at least one slice occurs during the relaxation time for the scan of another slice.

5. A system for imaging a body by nuclear magnetic resonance using data obtained by $T_1$ experiments, said system comprising:
    (a) apparatus and circuitry for producing a series of $\pi$ radio frequency pulses;
    (b) second apparatus and circuitry for applying in turn a series of $\pi/2$ radio frequency pulses, each with a magnetic field gradient for selecting a different slice of the body, said $\pi/2$ frequency pulses being timed to take place between successive ones of said sequence of $\pi$ radio frequency pulses, said second apparatus and circuitry comprising means for scanning for $T_1$ data in each of a plurality of planar parallel slices of said region to achieve volume scanning of a region, and
    (c) timing means for effecting said scanning of at least one slice during the relaxation time for the scan of another slice.

* * * * *